(12) United States Patent
Sharma et al.

(10) Patent No.: US 6,593,608 B1
(45) Date of Patent: Jul. 15, 2003

(54) MAGNETO RESISTIVE STORAGE DEVICE HAVING DOUBLE TUNNEL JUNCTION

(75) Inventors: Manish Sharma, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/098,204

(22) Filed: Mar. 15, 2002

(51) Int. Cl.7 ................................................ H01L 31/062
(52) U.S. Cl. ........................................ 257/295; 257/421
(58) Field of Search ................................ 257/295, 421; 365/158, 171

(56) References Cited

U.S. PATENT DOCUMENTS

| | | |
|---|---|---|
| 5,640,343 A | 6/1997 | Gallagher et al. |
| 5,793,697 A | 8/1998 | Scheuerlein |
| 5,991,193 A | 11/1999 | Gallagher et al. |
| 6,069,820 A * | 5/2000 | Inomata et al. ............ 365/171 |
| 6,081,446 A | 6/2000 | Brug et al. |
| 6,130,835 A | 10/2000 | Scheuerlein |
| 6,169,686 B1 | 1/2001 | Brug et al. |
| 6,172,904 B1 * | 1/2001 | Anthony et al. ............ 365/173 |
| 6,256,247 B1 | 7/2001 | Perner |
| 6,259,644 B1 | 7/2001 | Tran et al. |
| 6,297,987 B1 | 10/2001 | Johnson et al. |
| 2001/0040819 A1 * | 11/2001 | Hayashi et al. ............ 365/158 |
| 2002/0149962 A1 * | 10/2002 | Horiguchi .................... 365/173 |

* cited by examiner

Primary Examiner—David Nelms
Assistant Examiner—Tu-Tu Ho

(57) ABSTRACT

A magnetic memory device is disclosed that includes first and second soft reference layers, first and second barrier layers, and a sense layer, bound between the first and second barrier layers, which are further bound by the first and second soft reference layers.

15 Claims, 2 Drawing Sheets

MAGNETO RESISTIVE STORAGE DEVICE HAVING DOUBLE TUNNEL JUNCTION

BACKGROUND OF THE INVENTION

The present invention relates generally to magneto resistive storage devices and, more particularly, the present invention relates to magneto resistive storage devices that utilize a double tunnel junction for enhanced bit storage.

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

A typical MRAM device includes an array of memory cells, word lines extending along rows of the memory cells, and bit lines extending along columns of the memory cells. Each memory cell is located at a cross point of a word line and a bit line.

The memory cells may be based on tunneling magneto-resistive (TMR) devices such as spin dependent tunneling junctions (SDT). A typical SDT junction includes a pinned layer, a sense layer and an insulating tunnel barrier sandwiched between the pinned and sense layers. The pinned layer has a magnetization orientation that is fixed so as not to rotate in the presence of an applied magnetic field in a range of interest. The sense layer has a magnetization that can be oriented in either of two directions; the same direction as the pinned layer magnetization or the opposite direction of the pinned layer magnetization. If the magnetizations of the pinned and sense layers are in the same direction, the orientation of the SDT junction is said to be "parallel." If the magnetizations of the pinned and sense layers are in opposite directions, the orientation of the SDT junction is said to be "anti-parallel." These two stable orientations, parallel and anti-parallel, may correspond to logic values of '0' and '1.'

The magnetization orientation of the pinned layer may be fixed by an underlying antiferromagnetic (AF) pinning layer. The AF pinning layer provides a large exchange field, which holds the magnetization of the pinned layer in one direction. Underlying the AF layer are usually first and second seed layers. The first seed layer allows the second seed layer to be grown with a <111> crystal structure orientation. The second seed layer establishes a <111> crystal structure orientation for the AF pinning layer and other subsequently grown magnetic layers.

Advances have been made that have found that multiple pinned reference layers can be set independently, but must be grown on the <111> crystal structure in order to provide a more responsive reference layer. Further, it has been proposed in prior solutions to utilize a double magnetic tunnel junction having a single sense layer and two separate pinned layers. What is lacking, however, is the ability to provide a double MTJ cell that overcomes the need for pinning or pinned layers and the complicated materials required for their manufacture.

SUMMARY OF THE INVENTION

According to the present invention, a magnetic memory device is disclosed that includes a magneto-resistive cell that has a double tunnel junction utilizing soft reference layers.

Additional features and advantages of the invention will be apparent from the detailed description which follows, taken in conjunction with the accompanying drawings, which together illustrate, by way of example, features of the invention.

DETAILED DESCRIPTION OF SPECIFIC EMBODIMENTS

Figure 1:
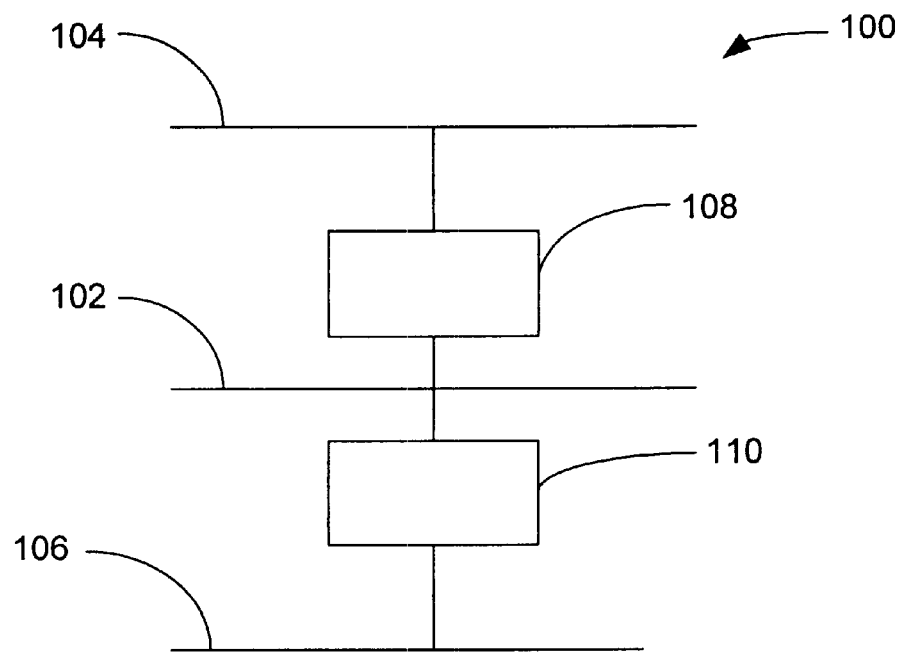
FIG. 1 illustrates a cross-sectional view of a magneto-resistive storage device that includes a double tunnel junction cell in accordance with the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

FIG. 1 illustrates a cross-sectional view of a magnetic memory device 100 that includes a conductive sense layer 102, a first conductor layer 104, a second conductor layer 106, a first magnetic tunnel junction 108 and a second magnetic tunnel junction 110. Magnetic tunnel junctions 108 and 110 form a magnetic double tunnel junction cell.

Figure 2:
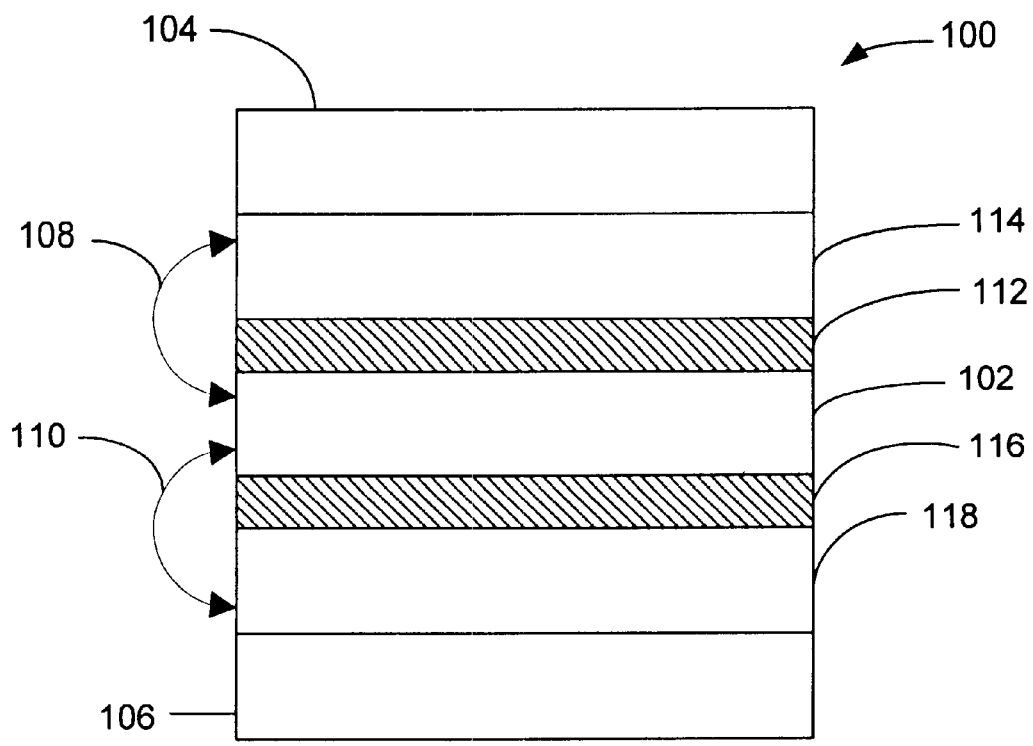
FIG. 2 illustrates a cross-section of a double junction cell as fabricated in accordance with the present invention.

The actual physical structure of magnetic memory device 100 is further illustrated in the cross-sectional diagram of FIG. 2. FIG. 2 illustrates the fabrication layers required in forming the conductor layers, the double tunnel junctions, and the sense layer as shown in FIG. 1. During the stages of fabrication, the second conductive layer 106 is fabricated on a substrate material of semiconductor, typically silicon, but other types of semiconductor materials are suitable for fabrication of the magnetic double tunnel junction memory cell device 100. Conductor layer 106 serves two purposes. Layer 106 first serves as the bottom conductor to provide a path for electrical current to flow during specific operations. Secondly, layer 106 serves as a seed layer to assist the growth of subsequent layers with desired materials properties as described below.

Conductor layer 106 may be fabricated from such well-known materials as Cu, Ta, Ta/Cu, Ta/Ru or Cu/Ru multi-layer combinations, among others. The materials may optionally be selected because of their ability to promote subsequent growth of films with <111> crystal texture. This allows for subsequent deposition of a layer of NiFe on the layer 106 to have higher <111> orientation of its crystal texture. The growth orientation is needed to achieve the pinning effect within a reference layer in the subsequent stack where subsequent layers also have the <111> crystal texture. Of note, the <111> crystal texture is provided in the bottom electrode to promote bottom spin values and in the top electrode to promote top spin values.

On top of second conductor layer 106 is fabricated a soft reference layer 118. Soft reference layer 118 is called "soft" because it is made from a magnetically soft material, such as NiFe or NiFeCo. There are several ways to achieve a soft reference layer. One way is to make a material that is "ultra-soft" such that the coercivity of the soft reference layer is lower than that of the bit layer. Soft reference layer 118 also assumes a <111> crystal texture to promote enhanced magnetic orientation for aligning a magnetic field in one of two states. An alternative way of making a soft reference layer is to clad the bit line with a ferromagnetic material (e .g., NiFe). The cladding forms a soft or ultra-soft reference line, where the coercivity of the bit line is lower than that of the bit layer 102. Examples of soft reference layers that are either accomplished via lower coercivity or by cladding the line desired to be a soft reference line are described in commonly assigned U.S. patent application Ser. No. 09/963171, herein incorporated by reference for all purposes.

A barrier layer 116 is fabricated on soft reference layer 118. Barrier layer 116 is typically an insulating tunnel barrier that allows quantum mechanical tunneling to occur between sense layer 102 and soft reference layer 118. This tunneling phenomenon is electron spin dependent, causing resistance of the magnetic tunnel junction to be a function of the relative orientations of the magnetization vectors of the soft reference layer 118 and the sense layer 102. For instance, the resistance of the magnetic tunnel junction is a first value (R) if the magnetization orientation of the magnetic tunnel junction is parallel and a second value (R+ΔR) if the magnetization orientation is anti-parallel. The insulating tunnel barrier 116 may be made of aluminum oxide ($Al_2O_3$), silicon dioxide ($SiO_2$), tantalum oxide ($Ta_2O_5$), silicon nitride ($SiN_4$), aluminum nitride ($AlN_x$), or magnesium oxide (MgO). Other dielectrics and certain semiconductor materials may be used for the insulating tunnel barrier 116. The thickness of insulating barrier 116 may range from about 0.5 nanometers to about 3 nanometers.

Sense layer 102 is then fabricated on barrier layer 116. Sense layer 102 is made from a "harder" magnetic material than that of soft reference layer 118. It should be noted that both the sense and reference layers are made of soft magnetic materials and here the term "harder" is relative. Thus, the coercivity of sense layer 102 is much higher than the coercivity of soft reference layer 118. The soft reference layer 118 is considered to be "softer" than the sense layer 102 because its magnetization vector is much easier to flip. The coercivities of the two layers 118 and 102 may be made different by using different bit shapes, geometries, compositions, thicknesses, etc. for the two layers 118 and 102. Potential ferromagnetic layer materials include nickel iron (NiFe), nickel iron cobalt (NiFeCo), cobalt iron (CoFe), other magnetically soft alloys of NiFe and Co, doped amorphous ferromagnetic alloys, and PERMALLOY™. For example, sense layer 102 may be made of a material such as NiFe or CoFe, and the reference layer 108 may be made of the same material or a different material such as, for example, NiFeCo, as previously mentioned.

The layers 102, barrier layer 116, and reference layer 118 form second magnetic tunnel junction 110.

After sense layer 102 is fabricated, a barrier layer 112 is fabricated thereon. Next, a reference layer 114 is fabricated on barrier layer 112. Lastly, first conductor layer 104 is fabricated on the soft reference layer 114. The materials for barrier layer 112 are identical to those of barrier layer 116 as previously described. Likewise, the materials utilized to fabricate soft reference layer 114 are similar to those utilized for soft reference layer 118. Further, the conductor layer 104 is typically fabricated in a manner similar to that utilized to fabricate layer 106. Thus, there is an inversion or mirror order of materials that is symmetrical about sense layer 102 in fabrication of the memory device 100. Sense layer 102, barrier layer 112, and soft reference layer 114 form the first magnetic tunnel barrier junction 108. Junction 108 operates in the same fashion as junction 110 as previously mentioned.

If the magnetization vectors (not shown) of the sense layer 102 and the soft reference layer 114 or 116 are pointing in the same direction, the orientation of the first (or second) SDT junction 108 (or 110) formed by the sense layer 102, barrier layer 112 (or 116), and soft reference layer 114 (or 118), is said to be "parallel." If the magnetization vectors of the soft reference layer 114 (or 118) and the sense layer 102 are pointing in opposite directions, the orientation of the magnetic tunnel junction is said to be "anti-parallel." These two stable orientations, parallel and anti-parallel, correspond to logic values of "0" and "1."

The sense layer 102, which is fabricated of a ferromagnetic layer, with its magnetization free to switch from one direction to the other also serves as the sense/free/data layer. The other conductor in junction 108 (or 110) consists of a ferromagnetic reference layer 114 (or 118), which is "magnetically softer" than the sense layer; ie, it has a lower coercivity than the sense layer. The conductor layer 104 serves to impose a current on sense layer 102 during operation and also serves as a bit line within a memory array where first bottom conductor 106 and second top conductor 104 serve as word lines within the array.

Of note, when left to themselves, the soft reference layers 118 and 114 may or may not have a fixed magnetization of their own. As an external field is applied via a current through conductor layer 106 or a combination of currents through layers 104 and 106, the magnetization of layer 118 changes orientation and eventually switches to a known direction. Similarly, as an external field is applied via a current through conductor layer 104 or a combination of currents through conductors 104 and 106, the magnetization of layer 114 changes orientation and eventually switches to a known direction. Because the direction of the layers 118 and 114 are known once current is applied, they can be used as reference layers. These layers 114 and 118 are fabricated such that they have lower coercivity than the bit layer 102. Thus, at small enough applied currents (hence magnetic fields), the soft reference layers 114 and 118 can be oriented without significantly altering the state of the bit stored in the bit or sense layer 102. At higher fields, the reference layers 114 and 118 are still oriented and the bit layer 102 can be switched if desired. So, the parallel orientation happens when the magnetic orientation of either soft reference layers 114 or 118 is the same direction as the magnetization of sense layer 102. Similarly, the anti-parallel orientation happens when the magnetic orientation of either soft reference layer 114 or 118 is the opposite of the magnetic orientation of sense layer 102.

Significantly, the two reference layers 114 and 118 can be set independently of one another. This means that either reference layer may be set in the same or opposite directions from one another. Further, since no pinning or pinned layer materials are necessary, the complications involved in manufacturing a memory device with such materials are eliminated. Further still, traditional pinned layers required an annealing step in order to set their pinning field properly. Since there are no pinned layers within the present embodiment, the annealing step is eliminated.

Further, the use of dual or double tunnel junctions coupled to a single sense line allows for two bits per cell to be stored.

Additionally, the dual junctions allow for a data bit to be stored in one junction while a reference bit may be stored in the second junction, which can allow for differential sensing to be performed. Alternatively, the tunneling magnetoresistance may be increased per cell by utilizing the two tunnel junctions in a series cell. This would eliminate the need for differential sensing cells and increases the accuracy of the bits stored over that of the prior art using but a single tunneling junction. Thus, the voltage over two junctions is greater than that over one junction, which eliminates or at least overcomes some of the signal attenuation that occurs in prior art systems.

Data may be written to the magnetic tunnel junction formed by the sense layer 102, barrier layers 112 and 116, and soft reference layers 114 and 118 by supplying write currents to sense layer 102 via conductive layer 104 and 106. The current supplied to the sense layer 102 generates a magnetic field about sense layer 102 and the current supplied to conductor layer 104 and 106 generate magnetic fields about conductor layers 104 and 106 respectively. The two magnetic fields, when combined, exceed the coercivity of the sense layer 102 and, therefore, cause the magnetization vector of the sense layer 102 to be set in a desired orientation, depending upon the directions of the currents supplied to layers 104 and 106. One magnetization orientation of the sense layer 102 defines a logic value 1 and the opposite orientation a logic value 0. Since their coercivities are lower than that of the sense layer, the reference layers 114 and 118 may also be forced by the magnetic fields to get oriented. This does not matter since the reference layers need to be placed in a known orientation only during the read process.

Figure 3:
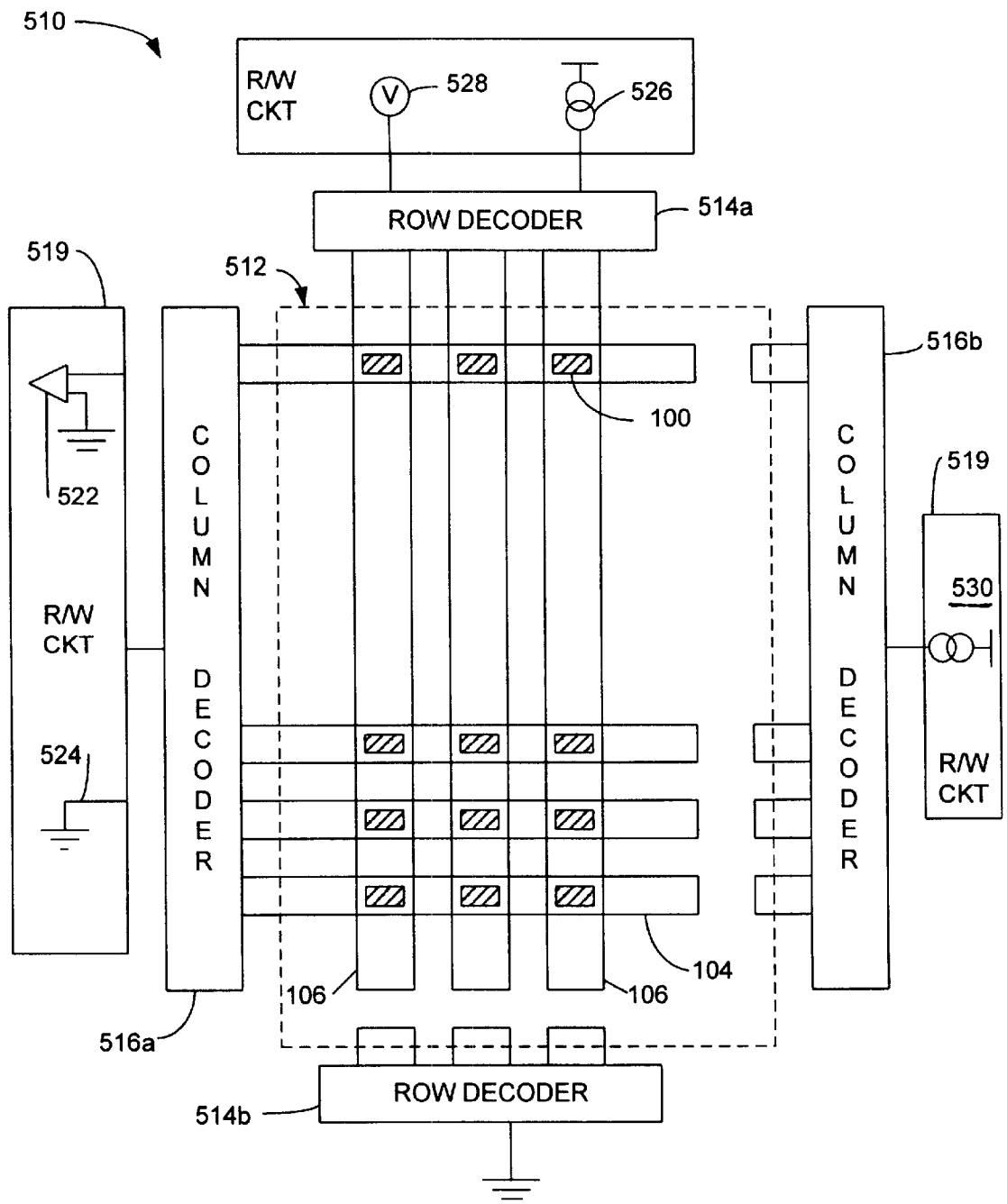
FIG. 3 illustrates a schematic diagram of a memory array with supporting logic as implemented within the present invention.

FIG. 3 illustrates a magnetic random access memory (MRAM) device 510 that includes word lines 104 and bit lines 106, which are the first and second conductor layers of FIG. 1. Magnetic double tunnel junctions 100 are located at cross points of word lines 104 and bit lines 106. The magnetic double tunnel junctions 100 are arranged in rows and columns, with the rows extending along an X direction and the columns extending along a Y direction. Only a relatively small number of magnetic double tunnel Junctions 100 are shown to simplify the illustration of the MRAM device 510. In practice, arrays of any size may be used.

Traces functioning as word lines 104 extend along the X direction in a plane on one side of the array 512 Traces functioning as bit lines 106 extend along the Y direction in a plane on an adjacent side of the array 512. The word lines 104 and the bit lines 106 are in contact with the soft reference layers of the first and second tunnel junction 108 and 110, respectively, of FIG. 1

The MRAM device 512 also includes first and second row decoders 514a and 514b, first and second column decoders 516a and 516b, and a read/write circuit 519. The read/write circuit 519 includes a sense amplifier 522, ground connectors 524, a row current source 526, a voltage source 528, and a column current source 530.

Although the present invention has been described in connection with a TMR device, it is not so limited. The present invention may be applied to other types of magneto resistive devices that have similar operational characteristics. For instance, the present invention may be applied to giant magneto resistive (GMR) devices. A GMR device has the same basic configuration as a TMR device, except that data and reference layers are separated by a conductive non-magnetic metallic layer instead of an insulating tunnel barrier (barrier layer 110 of FIG. 3). The separation ranges from 0.5 to 3 nm. Exemplary spacer layer metals include gold, silver, and copper. The relative orientations of the data and reference magnetization vectors affect in-plane resistance of GMR device.

It is to be understood that the above-referenced arrangements are only illustrative of the application for the principles of the present invention. Numerous modifications and alternative arrangements can be devised without departing from the spirit and scope of the present invention. For example, the spin-valve structure is not restricted to memory applications alone. The exact same structure may be used for field sensors, magnetic read heads. Each application will of course require redesign in the tunnel junction characteristics (TMR value, absolute resistance, coercivity, switching field, etc), but such redesign is well within the ability of the skilled artisan with only modest experimentation. While the present invention has been shown in the drawings and fully described above with particularity and detail in connection with what is presently deemed to be the most practical and preferred embodiments(s) of the invention, it will be apparent to those of ordinary skill in the art that numerous modifications can be made without departing from the principles and concepts of the invention as set forth in the claims.

What is claimed is:

1. A magnetic memory device comprising:

first and second soft reference layers;

first and second barrier layers; and a sense layer, bound between the first and second barrier layers, which are further bound by the first and second soft reference layers.

2. A magnetic memory device according to claim 1 wherein the first and second soft reference layers can be dynamically set independently of one another.

3. A magnetic memory device according to claim 1 wherein the magnetic memory device is a magnetic tunneling junction cell having two junctions, one between the first barrier layer and the second between the second barrier layer.

4. A magnetic memory device according to claim 1 wherein the first junction defines a first magnetic bit and the second junction defines a second magnetic bit.

5. A magnetic memory device according to claim 4 wherein the first magnetic bit can be oriented independently of the second magnetic bit.

6. A magnetic memory device comprising:

a first junction defined by a sense layer, a first dynamically settable reference layer, and a first barrier layer sandwiched between the sense and first reference layers; and a second junction defined by the sense layer, a second dynamically settable reference layer, and a second barrier layer sandwiched between the sense and second reference layers.

7. The magnetic memory device according to claim 6 wherein the first and second reference layers are magnetically soft.

8. The magnetic memory device according to claim 6 wherein the first junction defines a first magnetic tunneling junction bit and the second junction defines a second magnetic tunneling junction bit.

9. The magnetic memory device according to claim 8 wherein the first magnetic tunneling junction bit can be oriented independently of the second magnetic tunneling junction bit.

10. The magnetic memory device according to claim 6 further comprising a first write layer, electrically coupled to the first reference layer, and a second write layer, electrically coupled to the second reference layer.

11. An information storage device comprising an array of memory cells, each memory cell comprising:

a first junction defined by a sense layer, a first dynamically settable reference layer, and a first barrier layer sandwiched between the sense and first reference layers; and a second junction defined by the sense layer, a second dynamically settable reference layer, and a second barrier layer sandwiched between the sense and second reference layers.

12. The device according to claim 11 wherein the first and second reference layers are magnetically soft.

13. The device according to claim 11 wherein the first junction defines a first magnetic tunneling junction bit and the second junction defines a second magnetic tunneling junction bit.

14. The device according to claim 13 wherein the first magnetic tunneling junction bit can be oriented independently of the second magnetic tunneling junction bit.

15. The device according to claim 11 further comprising a plurality of first traces extending along the array in a first direction and a plurality of second traces, extending along the array in the first direction parallel to the plurality of the first traces, each of the plurality of first traces being electrically coupled to a portion of the first reference layers and each of the plurality of second traces being electrically coupled to a portion of the second reference layers.

* * * * *